(12) United States Patent
Li et al.

(10) Patent No.: US 10,770,314 B2
(45) Date of Patent: Sep. 8, 2020

(54) SEMICONDUCTOR DEVICE, TOOL, AND METHOD OF MANUFACTURING

(71) Applicant: Taiwan Semiconductor Manufacturing Company, Ltd., Hsinchu (TW)

(72) Inventors: Meng-Hsien Li, Hsinchu (TW); Hsin-Hsien Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/666,063

(22) Filed: Aug. 1, 2017

(65) Prior Publication Data

US 2018/0350634 A1     Dec. 6, 2018

Related U.S. Application Data

(60) Provisional application No. 62/512,909, filed on May 31, 2017.

(51) Int. Cl.
*H01L 21/768* (2006.01)
*B08B 3/08* (2006.01)
(Continued)

(52) U.S. Cl.
CPC ......... *H01L 21/67023* (2013.01); *B08B 3/08* (2013.01); *B08B 7/0035* (2013.01); *H01J 37/32899* (2013.01); *H01L 21/02063* (2013.01); *H01L 21/31111* (2013.01); *H01L 21/67028* (2013.01); *H01L 21/76813* (2013.01);
(Continued)

(58) Field of Classification Search
CPC ......... H01L 21/67023; H01L 21/76877; H01L 21/76814; H01L 21/31111; H01L 21/02063; H01L 21/76843; H01L 21/67028; H01L 21/76813; H01L 21/76832; H01L 2221/101; H01L 21/67011; B08B 3/08; B08B 7/0035; H01J 37/32899

See application file for complete search history.

(56) References Cited

U.S. PATENT DOCUMENTS

| 5,900,103 A | 5/1999 | Tomoyasu et al. |
| 6,004,881 A | 12/1999 | Bozada et al. |

(Continued)

FOREIGN PATENT DOCUMENTS

| CN | 101553912 A | 10/2009 |
| CN | 102160147 A | 8/2011 |

(Continued)

*Primary Examiner* — Nadine G Norton
*Assistant Examiner* — Mahmoud Dahimene
(74) *Attorney, Agent, or Firm* — Slater Matsil, LLP

(57) ABSTRACT

A semiconductor device is manufactured using a cleaning process. The cleaning process utilizes a semiconductor manufacturing tool that has a wet cleaning section and a plasma cleaning section. The semiconductor device is placed within a wet cleaning chamber within the wet cleaning section, where a wet cleaning process is performed. Once completed, and without breaking atmosphere, the semiconductor device is removed from the wet cleaning section and placed within a plasma cleaning chamber within the plasma cleaning section. A plasma clean is then performed.

20 Claims, 7 Drawing Sheets

(51) Int. Cl.
  *H01L 21/67*   (2006.01)
  *H01L 21/02*   (2006.01)
  *H01L 21/311*  (2006.01)
  *B08B 7/00*    (2006.01)
  *H01J 37/32*   (2006.01)

(52) U.S. Cl.
  CPC .. *H01L 21/76814* (2013.01); *H01L 21/76843* (2013.01); *H01L 21/76877* (2013.01); *H01L 21/76832* (2013.01)

(56) References Cited

U.S. PATENT DOCUMENTS

| | | |
|---|---|---|
| 6,007,675 A | 12/1999 | Toshima |
| 8,434,993 B2 | 5/2013 | Azumano et al. |
| 9,147,592 B2 | 9/2015 | Englhardt et al. |
| 9,512,520 B2 | 12/2016 | Sanchez et al. |
| 2002/0044860 A1 | 4/2002 | Hayashi et al. |
| 2003/0045098 A1 | 3/2003 | Verhaverbeke et al. |
| 2003/0084918 A1* | 5/2003 | Kim ............... H01L 21/67173 134/1.2 |
| 2004/0200417 A1* | 10/2004 | Hanawa ............... C23C 14/48 |
| 2007/0292603 A1* | 12/2007 | Dordi ............... H01L 21/0206 427/98.1 |
| 2008/0057221 A1 | 3/2008 | Boyd et al. |
| 2009/0142931 A1 | 6/2009 | Wang et al. |
| 2009/0218691 A1* | 9/2009 | Yang ............... H01L 21/76805 257/751 |
| 2010/0075488 A1 | 3/2010 | Collins et al. |
| 2010/0301491 A1* | 12/2010 | Yang ............... H01L 21/02063 257/773 |
| 2014/0235068 A1 | 8/2014 | Ashihara et al. |
| 2014/0242804 A1 | 8/2014 | Ku et al. |
| 2014/0255844 A1 | 9/2014 | Iwao et al. |
| 2015/0240360 A1 | 8/2015 | Leeser |
| 2015/0348902 A1* | 12/2015 | Naik ............... H01L 21/02068 257/774 |
| 2017/0014871 A1 | 1/2017 | Cai et al. |

FOREIGN PATENT DOCUMENTS

| | | |
|---|---|---|
| CN | 103493180 A | 1/2014 |
| KR | 20040063920 A | 7/2004 |
| KR | 20090069278 A | 6/2009 |
| KR | 20140109816 A | 9/2014 |
| KR | 20150100567 A | 9/2015 |
| WO | 03041149 A1 | 5/2003 |

* cited by examiner

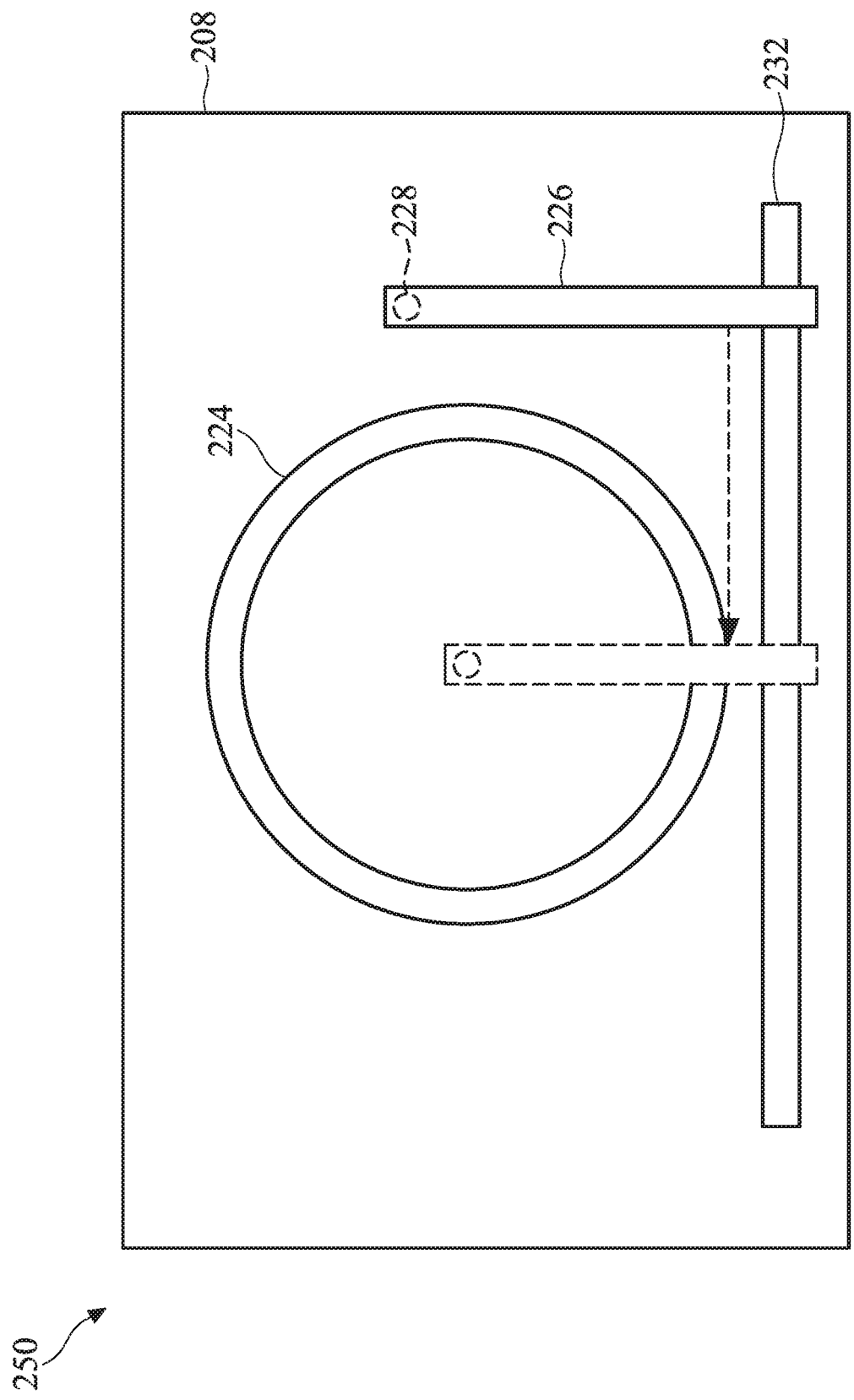

SEMICONDUCTOR DEVICE, TOOL, AND METHOD OF MANUFACTURING

PRIORITY CLAIM AND CROSS-REFERENCE

This application claims priority to and the benefit of U.S. Provisional Application No. 62/512,909, filed on May 31, 2017, entitled "SEMICONDUCTOR DEVICE, TOOL, AND METHOD OF MANUFACTURING," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C illustrate a semiconductor manufacturing tool, in accordance with some embodiments.

DETAILED DESCRIPTION

Figure 1A:
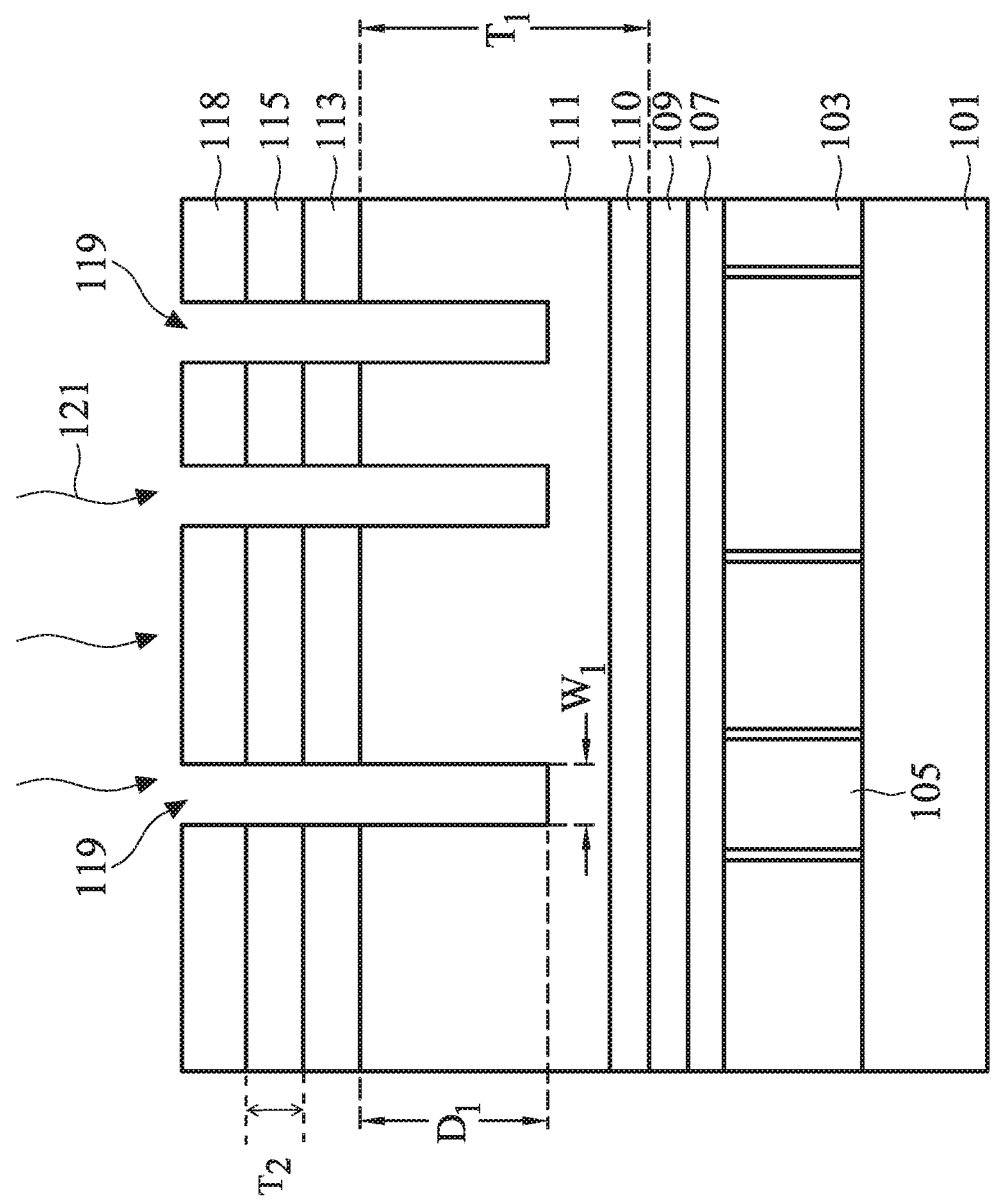
FIGS. 1A-1C illustrate formation of a via opening and a trench opening in a low k dielectric, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments, such as a cleaning process during a via first, trench last damascene process for a 20 nm, 16 nm, 10 nm, 7 nm, or 5 nm process node. However, the ideas described herein can applied in any suitable process.

Figure 1B:
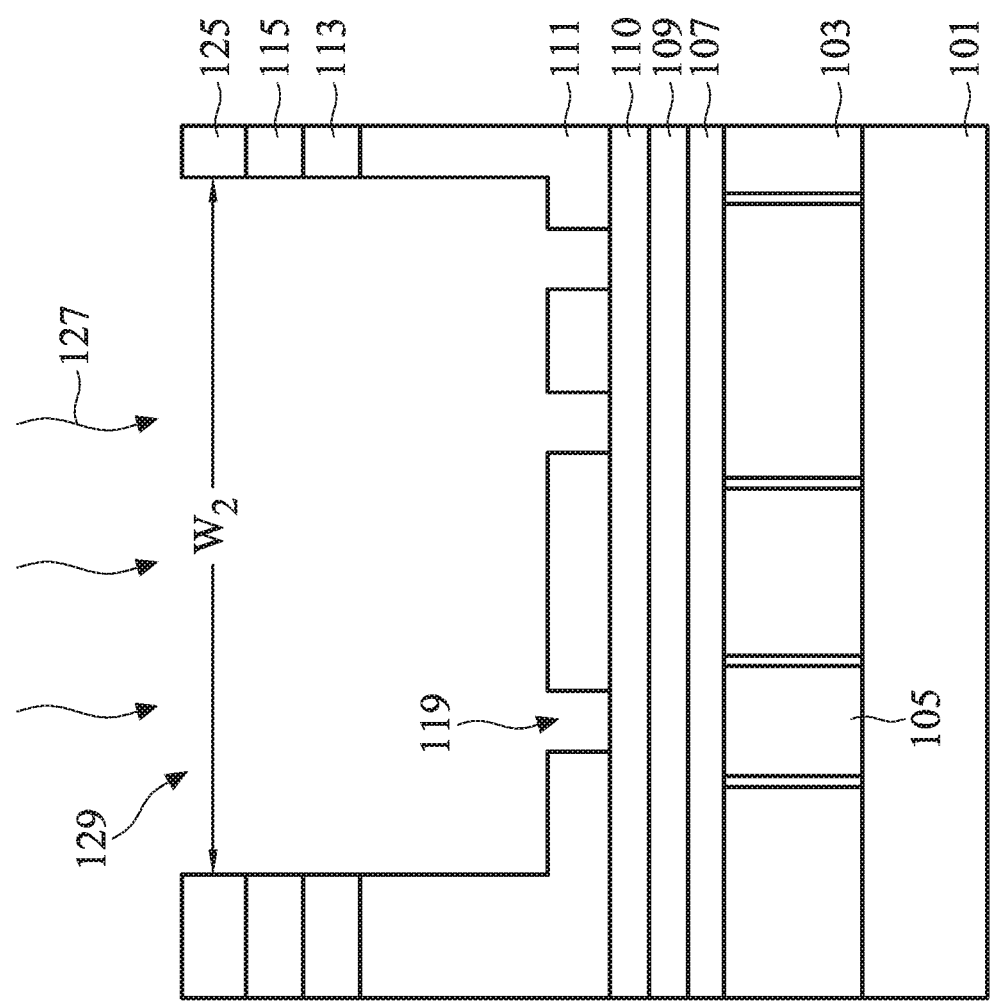
Figure 1C:
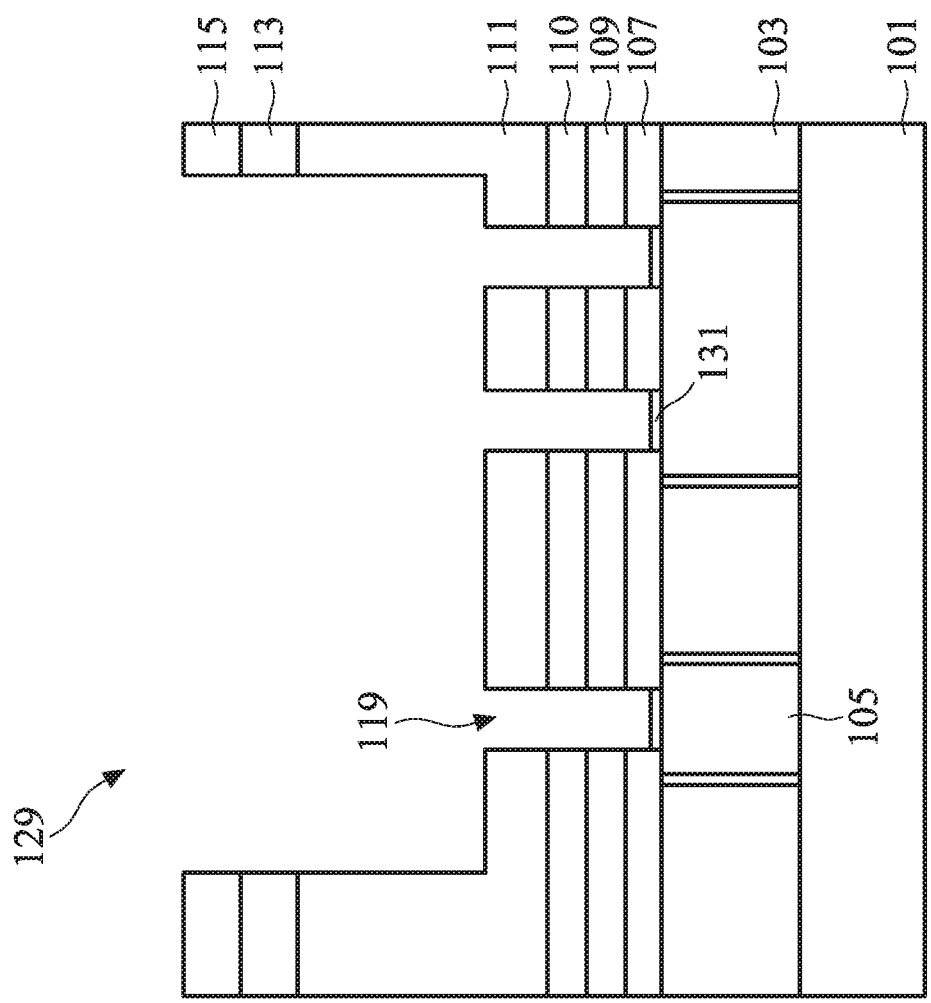

With reference now to FIGS. 1A-1C, FIG. 1A illustrates a substrate 101 with active devices (not separately illustrated), metallization layers 103 (including both an unlabeled dielectric material and conductive elements 105 within the dielectric material), a first etch stop layer 107, a second etch stop layer 109, a third etch stop layer 110, and a first dielectric layer 111. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the substrate 101.

The metallization layers 103 are formed over the substrate 101 and the active devices and are designed to connect the various active devices to form functional circuitry for the design. In an embodiment the metallization layers are formed of alternating layers of dielectric and conductive material and may be formed through any suitable process (such as deposition, damascene, dual damascene, etc.). In an embodiment there may be one to four layers of metallization separated from the substrate 101 by at least one interlayer dielectric layer (ILD), but the precise number of metallization layers is dependent upon the design.

Figure 3:
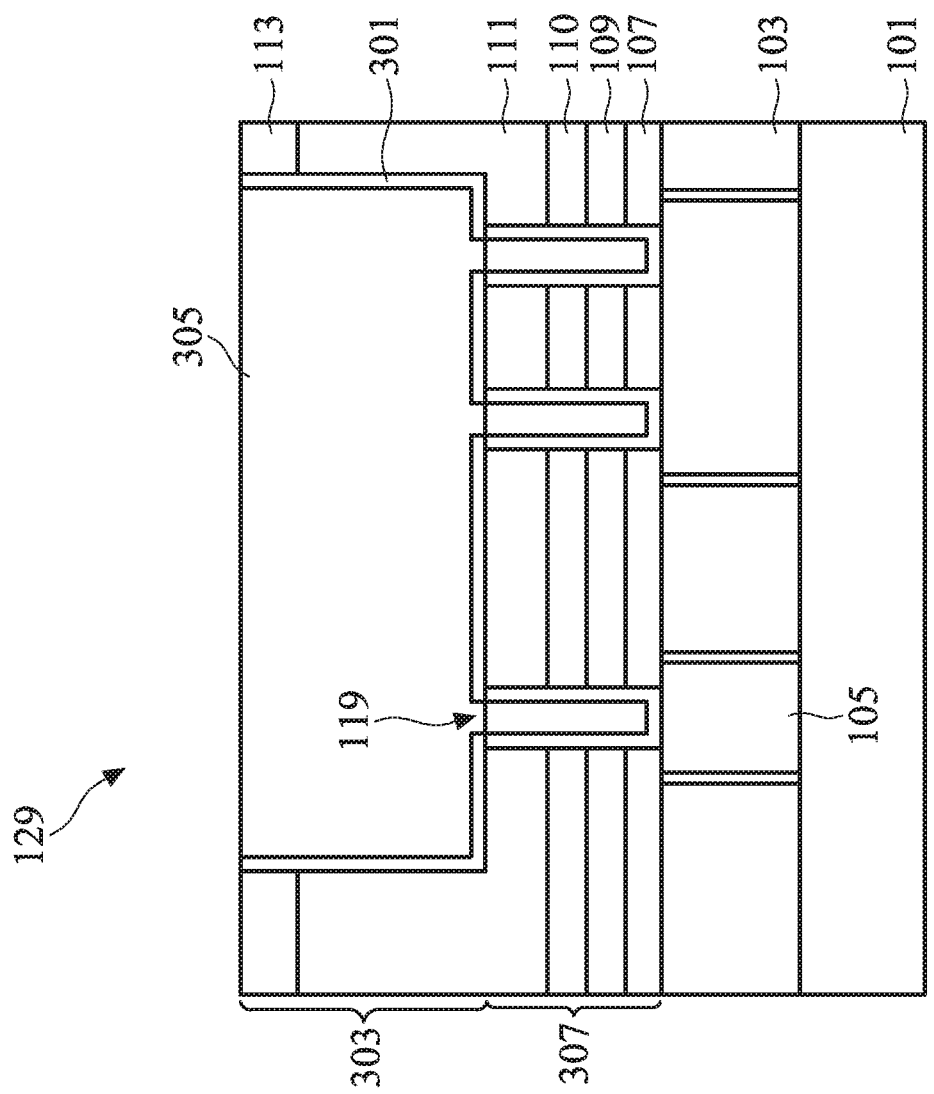
FIG. 3 illustrates formation of conductive material within the via opening and the trench opening in accordance with some embodiments.

The conductive elements 105 may be formed in an upper portion of the metallization layers 103, and is a region to which an interconnect 305 (not illustrated in FIG. 1A but illustrated and described below with respect to FIG. 3) will make physical and electrical connection. In an embodiment the conductive elements 105 may be a material such as copper formed using, e.g., a damascene or dual damascene process, whereby an opening is formed within an upper portion of the metallization layers 103, the opening is filled and/or overfilled with a conductive material such as copper, and a planarization process is performed to embed the conductive material within the metallization layers 103. However, any suitable material and any suitable process may be used to form the conductive elements 105.

A first etch stop layer 107 is used to protect the underlying structures and provide a control point for a subsequent etching process through, e.g., the second etch stop layer 109. In one embodiment, the first etch stop layer 107 may be formed of aluminum oxynitride (AlON) using plasma enhanced chemical vapor deposition (PECVD), although other materials such as nitrides, carbides, borides, combinations thereof, or the like, and alternative techniques of forming the first etch stop layer 107, such as low pressure CVD (LPCVD), PVD, or the like, could alternatively be used. The first etch stop layer 107 may have a thickness of between about 50 Å and about 2,000 Å, such as about 200 Å.

Once the first etch stop layer 107 has been formed to cover the conductive elements 105, the second etch stop layer 109 is formed over the first etch stop layer 107. In an embodiment the second etch stop layer 109 is formed of a material such as a carbon doped oxide such as SiOC, although any other suitable material may also be used. The material of the second etch stop layer 109 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the second etch stop layer 109 has been formed, the third etch stop layer 110 is formed over the second etch stop layer 109. In an embodiment the third etch stop layer 110 is formed of a material such as aluminum oxide, although any suitable material, such as aluminum nitride, may also be used. The material of the third etch stop layer 110 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the third etch stop layer 110 has been formed, the first dielectric layer 111 may be formed in order to help isolate the interconnect 305 (not illustrated in FIGS. 1A-1C but illustrated and discussed further below with respect to FIG. 3) from other adjacent electrical routing lines. In an embodiment the first dielectric layer 111 may be, e.g., a low-k dielectric film intended to help isolate the interconnect 305 from other structures. By isolating the interconnect 305, the resistance-capacitance (RC) delay of the interconnect 305 may be reduced, thereby improving the overall efficiency and speed of electricity through the interconnect 305.

In an embodiment the first dielectric layer 111 may be a porous material such as SiOCN, SiCN or SiOC and may be formed by initially forming a precursor layer over the third etch stop layer 110. The precursor layer may comprise both a matrix material and a porogen interspersed within the matrix material, or may alternatively comprise the matrix material without the porogen. In an embodiment the precursor layer may be formed, e.g., by co-depositing the matrix material and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the metallization layers 103, may also be utilized.

The precursor layer may be formed to a thickness sufficient to provide the isolation and routing characteristics that are desired of the first dielectric layer 111. In an embodiment, the precursor layer may be formed to a first thickness $T_1$ of between about 10 Å and about 1000 Å, such as about 300 Å. However, these thicknesses are meant to be illustrative only, and are not intended to limit the scope of the embodiments, as the precise thickness of the precursor layer may be any suitable desired thickness.

The matrix material, or base dielectric material, may be formed using a process such as PECVD, although any suitable process, such as a chemical vapor deposition (CVD), physical vapor deposition (PVD), or even spin-on coating, may alternatively be utilized. The PECVD process may utilize precursors such as methyldiethoxy silane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, and the like may alternatively be utilized. However, as one of ordinary skill in the art will recognize, the materials and processes listed herein are merely illustrative and are not meant to be limiting to the embodiments, as any other suitable matrix precursors may alternatively be utilized.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the first dielectric layer 111. For example, an anneal of between about 200° C. and about 500° C., such as about 400° C., for between about 10 seconds and about 600 seconds, such as about 200 seconds, may be utilized.

However, as one of ordinary skill in the art will recognize, the thermal process described above is not the only method that may be utilized to remove the porogen from the matrix material to form the first dielectric layer 111. Other suitable processes, such as irradiating the porogen with UV radiation to decompose the porogen or utilizing microwaves to decompose the porogen, may alternatively be utilized. These and any other suitable process to remove all or a portion of the porogen are all fully intended to be included within the scope of the embodiments.

FIG. 1A additionally illustrates a placement of an anti-reflective layer 113. In an embodiment the anti-reflective layer 113 may be a nitrogen-free anti-reflective coating and may comprise a polymer resin, a catalyst, and a cross-linking agent, all of which are placed into a solvent for dispersal. The polymer resin comprises a polymer chain with repeating units, such as a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, sulfur, or combinations thereof, such as pyranyl or acridinyl. The substituents in these units may be any hydrocarbyl group and may further contain heteroatoms, such as, oxygen, sulfur or combinations thereof, such as alkylenes, ester, ethers, combinations of these, or the like, with a number of carbon atoms between 1 and 12.

The cross-linking monomer may be used to cross-link the monomer with other polymers within the polymer resin to modify the solubility of the anti-reflective layer 113, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like.

The catalyst may be a compound that is used to generate a chemically active species and initiate a cross-linking reaction between the polymers within the polymer resin and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the anti-reflective layer 113. Specific examples of the thermal acid generator include butane sulfonic acid, triflic acid, nanoflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

The cross-linking agent may also be added to the anti-reflective layer 113. The cross-linking agent reacts with the polymers within the polymer resin within the anti-reflective layer 113, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

The materials for the anti-reflective layer 113 may be placed into a solvent for dispersal. In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Once the material for the anti-reflective layer 113 has been prepared, the material for the anti-reflective layer 113 may be utilized by initially applying the material for the anti-reflective layer 113 onto the first dielectric layer 111. The material for the anti-reflective layer 113 may be applied to the first dielectric layer 111 so that the material for the anti-reflective layer 113 coats an upper exposed surface of the first dielectric layer 111, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 113 may be applied such that it has a thickness of between about 50 nm and about 500 nm, such as about 300 nm.

Once the anti-reflective layer 113 has been formed, a first hardmask 115 may be formed over the anti-reflective layer 113. In an embodiment the first hardmask 115 may be a masking material with a different etching selectivity from the material of the second etch stop layer 109, such as titanium nitride (TiN), although any other suitable material, such as titanium oxide may be used. The first hardmask 115 may be formed using a deposition process such as chemical vapor deposition, physical vapor deposition, atomic layer deposition, combinations of these, or the like, and may be formed to an initial second thickness $T_2$ of between about 50 Å and about 800 Å, such as about 300 Å. However, any suitable thickness may be utilized.

Once formed, the first hardmask 115 may be patterned in order to provide a masking layer for a subsequent etching process (e.g. a first etching process 121 described below) to form a via opening 119. In an embodiment the first hardmask 115 may be patterned by placing a first photoresist 118 over the first hardmask 115 and then exposing and developing the first photoresist 118 to form a patterned photoresist. In an embodiment the first photoresist 118 is a tri-layer photoresist, with a bottom anti-reflective coating (BARC) layer, an intermediate mask layer, and a top photoresist layer (not separately illustrated within FIG. 1A). However, any suitable type of photosensitive material or combination of materials may be utilized. Once the first photoresist 118 has been patterned, the pattern of the first photoresist 118 is then transferred to the first hardmask 115 using, e.g., an anisotropic etching process such as a reactive ion etching process. However, any suitable process may be utilized.

In an embodiment the first hardmask 115 may be patterned to form a mask for the via opening 119. As such, the first hardmask 115 may be patterned such that the via opening 119 has a first width $W_1$ of between about 10 nm and about 40 nm, such as about 25 nm. However, any suitable dimensions may be utilized.

Once the first hardmask 115 has been patterned, the pattern of the first hardmask 115 may be transferred to the first dielectric layer 111 using a first etching process (represented in FIG. 1A by the wavy lines labeled 121). In an embodiment the first etching process 121 may be, e.g., an anisotropic etching process such as a reactive ion etch with etchants suitable to etch the first dielectric layer 111. However, any suitable etching method or combination of etching methods may be utilized.

By using the first etch process 121 and the first hardmask 115, the pattern of the first hardmask 115 is transferred to the anti-reflective layer 113 and then to the first dielectric layer 111 and the via opening 119 is formed. In an embodiment the transfer of the pattern from the first hardmask 115 into the first dielectric layer 111 helps to form the via portion 307 of the interconnect 305 into the first dielectric layer 111. In a particular embodiment, the via portion 307 of the interconnect 305 may be formed by the first etch process 121 to extend into the first dielectric layer 111 a first depth $D_1$ of between about 200 Å and about 2000 Å, such as about 800 Å. However, any suitable depth may be utilized.

FIG. 1B illustrates that, once the via opening 119 has been formed, the first photoresist 118 is removed. In an embodiment the first photoresist 118 is removed using a process such as ashing, whereby the temperature of the first photoresist 118 is increased until the first photoresist 118 experiences a thermal decomposition, at which point the first photoresist 118 may be easily removed. However, any other suitable process, such as a wet or dry etch, or even removing the first photoresist 118 using the same etching process that forms the via opening 119, may be used.

Once the first photoresist 118 has been removed, a second photoresist 125 may be deposited and patterned to form openings to assist in the patterning of trench openings 129. In an embodiment the second photoresist 125 is a tri-layer photoresist, with a bottom anti-reflective coating (BARC) layer, an intermediate mask layer, and a top photoresist layer (not separately illustrated within FIG. 1B). However, any suitable type of photosensitive material or combination of materials may be utilized.

Once the second photoresist 125 has been placed over the first hardmask 115 and the via opening 119, the second photoresist 125 is patterned. In an embodiment the second photoresist 125 may be patterned by exposing a photosensitive material within the second photoresist 125 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the second photoresist 125 are different from the physical properties of the unexposed portions of the second photoresist 125. The second photoresist 125 may then be developed with, e.g., a developer (not separately illustrated), in order to separate the exposed portion of the second photoresist 125 from the unexposed portion of the second photoresist 125, and the pattern of the top photoresist layer may be extended through the intermediate mask layer and the bottom anti-reflective coating layer.

In an embodiment the second photoresist 125 may be patterned such that the second photoresist 125 can be used to form the trench openings 129 through the first dielectric layer 111. As such, the second photoresist 125 may be formed to have openings with a second width $W_2$ of between about 40 nm and about 150 nm, such as about 50 nm. However, any suitable dimensions may be utilized.

Once the second photoresist 125 has been placed and patterned, a second etching process (represented in FIG. 1B by the wavy lines labeled 127) may be used to form trench openings 129 which will be filled to form via portions 303 of the interconnect 305. In an embodiment the second etching process 127 may be similar to the first etching process 121. For example, the second etching process 127 may be an anisotropic etching process such as a reactive ion etching process that utilizes etchants that are selective to the first dielectric layer 111.

The second etching process 127 will work to form the trench openings 129 and also extend the via opening 119 all of the way through the first dielectric layer 111 and will expose the underlying third etch stop layer 110, which material is chosen to stop or at least slow down the second etching process 127 and prevent the second etching process 127 from etching past the third etch stop layer 110. As such, the via openings 119 may extend into, but not through, the third etch stop layer 110.

FIG. 1C additionally illustrates that the via openings 119 may be extended through the third etch stop layer 110 and the second etch stop layer 109. In an embodiment the breakthrough of the via openings 119 through the third etch stop layer 110 and the second etch stop layer 109 is performed with one or more wet etching processes in which liquid etchants are brought into contact with the third etch stop layer 110 and then the second etch stop layer 109.

After the third etch stop layer 110 and the second etch stop layer 109 have been patterned to extend the via openings 119, the via openings 119 may be extended through the first etch stop layer 107. In an embodiment the extension of the via openings 119 through the first etch stop layer 107 exposes the underlying conductive elements 105, and may be performed using, e.g., a wet or dry etching process, although any suitable method may be utilized.

Once the conductive elements 105 have been exposed, a liner removal may be performed in order to remove any material from the first dielectric layer 111 that may have entered the trench openings 129 and via openings 119. In an embodiment the liner removal may be performed using an etching process such as a dry etch. For example, in an embodiment the liner removal dry etch may clean the openings as well as at least partially round the corners of the via openings 119 and the trench openings 129. However, any suitable dimensions may be used.

Figure 2A:
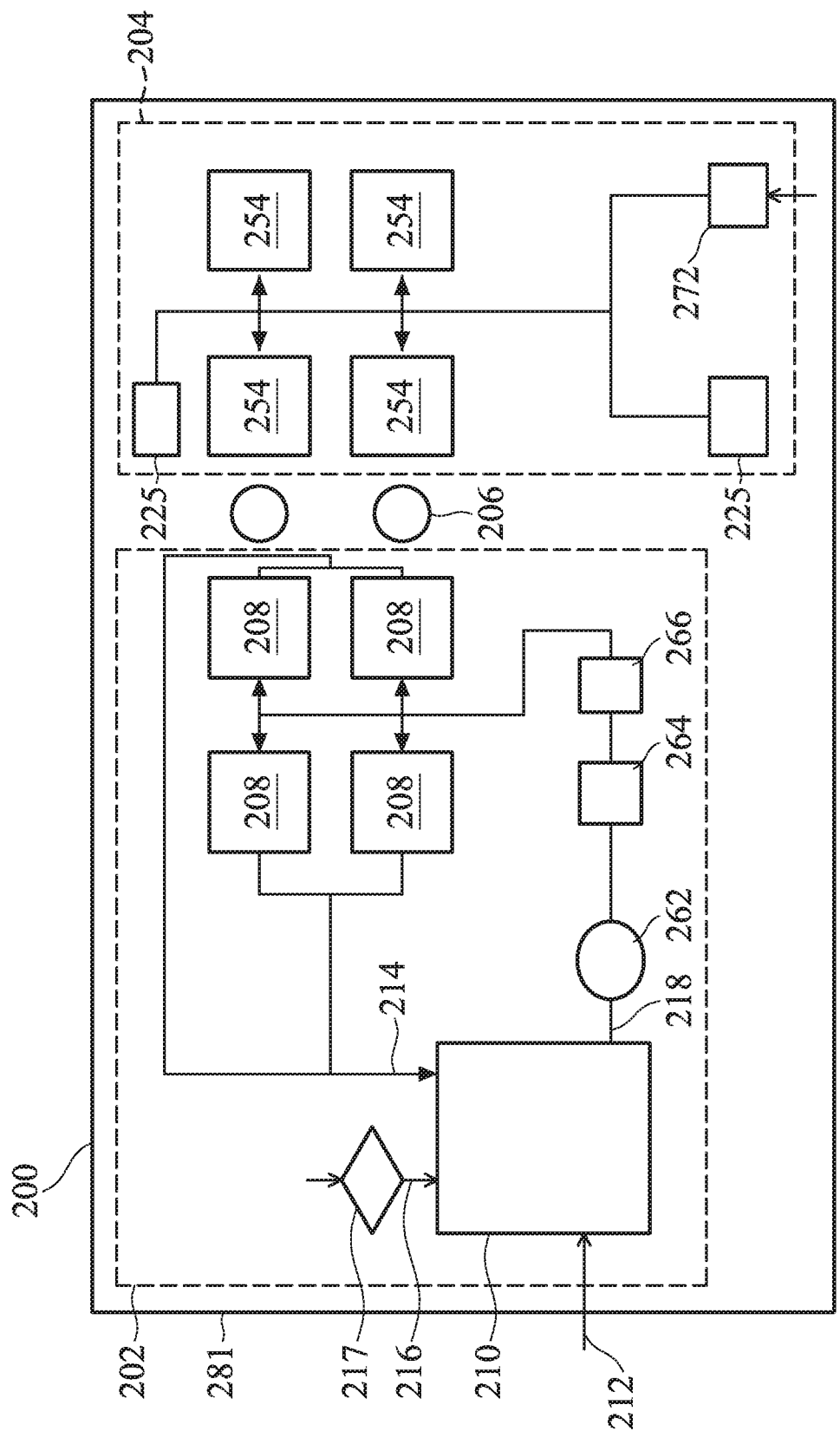

FIGS. 1C and 2A-2C illustrate that, once the conductive elements 105 have been exposed and the liner removal has been performed, the second photoresist 125 is removed using a cleaning/stripping process that both removes the second photoresist 125 as well as remove any remaining residue 131 left over from the previous processes (e.g., the etching residue), clean and pre-clean the surfaces of the trench openings 129 and the via openings 119 prior to placement of a first barrier layer 301 (not illustrated in FIGS. 2A-2C but described below with respect to FIG. 3), and, optionally, release charges that may have accumulated on the exposed surfaces. In an embodiment the cleaning process may comprise a wet cleaning process 250 (also called a wet etch cleaning process) followed by a plasma treatment, both of which are performed in a single, all-in-one, combined process machine 200 without breaking to an exterior atmosphere. For example, as illustrated in FIG. 2A, the combined process machine 200 comprises both a wet etching section 202 and a plasma treatment section 204, along with a transfer station 206 between the wet etching section 202 and the plasma treatment section 204, all of which are encased within an exterior housing 281 that separates the wet etching section 202, the plasma treatment section 204, and the transfer station 206 from an exterior environment.

In an embodiment the wet etching section 202 comprises a feed tank 210 in order to provide a suitable supply of a first etchant to each of a plurality of wet etching stations 208. The first etchant is utilized in order to remove the residues 131 from within the via opening 119 and the trench opening 129 and, as such, is at least partially dependent upon the materials and products utilized during the previous processes. However, in an embodiment in which the first etch stop layer 107 is aluminum oxynitride, the conductive elements 105 are copper, and the residues are a fluorinated polymer, the first etchant may be a solution comprising an oxidizer and a solvent.

For example, in an embodiment the oxidizer may be hydrogen peroxide, although any other suitable oxidizer, such as ozone water or phosphate salts, may also be used. In an embodiment the oxidizer may be placed within the solution at a concentration of less than about 25%, such as about 15%. However, any suitable concentration may be utilized.

The organic solvent is utilized to dilute and deliver the oxidizer. In an embodiment the organic solvent may be an organic liquid such as ethylene glycol, propylene glycol monomethyl ether, diethylene glycol monoethyl ether, diethylene glycol monobutyl ether, tetrahydrothiophene-1,1-dioxide, dimethylsulfoxide, N—N-dimethylacetamide, 4-methylmorpholine, 4-methylmorpholine N-oxide, 4-methoxypyridine-N-oxide hydrate, ammonium hydroxide, tetramethyl ammonium hydroxide, tetraethylammonium hydroxide, mixtures of these, or the like. The organic solvent may be within the solution at a concentration of between about 5% and about 50%, such as about 30%. However, any suitable material and concentration may be utilized.

Optionally, other additives may be placed into the solution for the first etchant. For example, etching inhibitors such as benzotriazole or imidazole may be placed into the solution in order to better control the etching characteristics of the first etchant. Any suitable additives may be added to the solution for the first etchant.

The first etchant may be placed into the feed tank 210 (otherwise known as a day tank) through a first input 212 connected to a suitable facility. Optionally, if the components of the first etchant (e.g., the oxidizer, the organic solvent, and any other additives) are received as separate components, an optional mixing unit (not separately illustrated) may be placed upstream from the feed tank 210. In this embodiment the individual components are placed within the mixing unit and mixed prior to being placed into the feed tank 210.

The feed tank 210 additionally has a second input 214 to recycle first etchant which has been used by the wet etching stations 208. For example, the second input 214 to the feed tank 210 is connected to respective outputs from each of the wet etching stations 208 so that, once the first etchant has been used within the wet etching stations 208 during, e.g., the wet cleaning process 250, the used first etchant can be recycled back to the feed tank 210 for recycling.

In order to help recover the used first etchant so that the first etchant can be recycled for another use, the feed tank 210 also comprises a third input 216 (and an associated flow meter 217) to receive additional components for the first etchant in order to recover the effectiveness of the first etchant. For example, additional amounts of the oxidizer (an oxidizer spike) may be entered through the third input 216 in order to raise the concentration of the oxidizer within the feed tank 210 and help reclaim any of the oxidizer that was used or otherwise lost during the wet cleaning process 250 within the wet etching stations 208.

Similarly, additional amounts of the solvent or any other additives may also be spiked in order to reclaim or otherwise retain the ability of the first etchant to perform as desired. In some embodiments, samples of the first etchant (from either the day tank or from the wet etching stations 208) may be taken and analyzed, and a makeup amount, if needed, for each component may be determined. Such a makeup amount of each component may then be added through the third input 216.

A first output 218 from the feed tank 210 is routed to a respective input of each of the wet etching stations 208 (described further below with respect to FIG. 2B) in order to supply each of the wet etching stations 208 with fresh first etchant for the wet cleaning process 250 performed within the wet etching stations 208. Optionally, the first output 218 also comprises additional units which help to control the physical characteristics of the first etchant after it leaves the feed tank 210 and prior to the first etchant being used in the wet cleaning process 250. For example, the first output 218 may comprise a first pump 262 to control the flow rate of the first etchant, a first heater 264 in order to control the temperature of the first etchant, and a first filter 266 in order to help purify the first etchant. However, any suitable control systems may be utilized.

The first output 218 supplies the first etchant to a number of wet etching stations 208. In the embodiment illustrated in FIG. 2A, the first output 218 supplies the first etchant to four wet etching stations 208. However, this number of wet etching stations 208 is intended to be illustrative only. Any suitable number of wet etching stations 208 may be utilized within the wet etching section 202 of the combined process machine 200.

FIG. 2B illustrates a top-down view of one embodiment of a single wet etching station 208. In this embodiment the wet etching station 208 is a spin-on station and comprises a rotating chuck 224, a dispensing arm 226, and a track 232. The rotating chuck 224 receives the substrate 101 and holds the substrate 101 during processing.

The dispensing arm 226 has a nozzle 228 in order to dispense the first etchant onto the substrate 101 such that the first etchant comes into physical contact with the residue 131. In an embodiment the dispensing arm 226 may be moveable relative to the rotating chuck 224 so that the dispensing arm 226 can move over the substrate 101 (illustrated in FIG. 2B by the arrow and dispensing arm illustrated in dashed lines) in order to evenly dispense the first etchant. The dispensing arm 226 may move back and forth with the help of the track 232, which provides a fixed reference to assist the dispensing arm 226 in its movement.

During the wet cleaning process 250, the substrate 101 is placed onto the rotating chuck 224 and the rotating chuck 224, holding the substrate 101, rotates at a speed of between about 100 rpms and about 1000 rpms, such as about 500 rpms, although any suitable speed may be utilized. While the rotating chuck 224 is rotating, the dispensing arm 226 may move over the substrate 101 and begin dispensing the first etchant onto the substrate 101 through the nozzle 228. The rotation of the substrate 101 helps the first etchant to spread evenly across the substrate 101 and reduce cleaning variations from uneven dispersal of the first etchant.

In an embodiment the first etchant may be dispersed at a temperature of between about 25° C. and about 60° C., such as about 50° C. Additionally, the first etchant may be dispensed at a flow rate of between about 500 mL/min and about 2500 mL/min, such as about 1500 mL/min. To help ensure removal of the residues 131, the wet cleaning process 250 may continue for a time of between about 30 s and about 240 s, such as about 120 s. However, any suitable process conditions and time periods may also be utilized.

Additionally, as one of ordinary skill in the art will recognize, the spin-on configuration illustrated in FIG. 2B and described above is intended to be illustrative only and is not intended to limit the embodiments. Rather, any suitable configuration for the wet etching station 208 that may be used to apply the first etchant, such as a dip coating configuration, an air-knife coating configuration, a curtain coating configuration, a wire-bar coating configuration, a gravure coating configuration, a lamination configuration, an extrusion coating configuration, combinations of these, or the like, may alternatively be utilized. All such suitable configuration for the wet etching station 208 are fully intended to be included within the scope of the embodiments.

Once the wet cleaning process 250 has been completed, the first etchant may be removed and the substrate 101 may be dried prior to removal from the wet etching station 208.

In an embodiment the substrate 101 may be dried by stopping the flow of the first etchant through the nozzle 228 while maintaining at least a partial rotation to spin-off the remaining first etchant. Additionally, if desired, a rinsing material, such as deionized water, may also be dispensed onto the substrate 101 to aid in the removal of the first etchant. Finally, a drying process such as dispensing a drying material such as IPA along with an application of nitrogen (N2), may be utilized to dry the substrate 101. However, any suitable method of removing the first etchant and drying the substrate 101 may be utilized.

Returning to FIG. 2A, once the wet cleaning process 250 has been completed within the wet etching station 208, the substrate 101 may be removed from the wet etching station 208 by the transfer station 206. In an embodiment the transfer station 206 may be one or more robotic arms (not individually illustrated in FIG. 2A) that can grip, move, and transfer the substrate 101 from the wet etching station 208 to, e.g., the plasma treatment section 204. In an embodiment the robotic arms may extend into the wet etching station 208, grip the substrate 101, and transfer the substrate 101 into the transfer station 206. Once inside, the transfer station 206 may have doors that close to isolate the transfer station 206 from the wet etching station 208 so that the wet etching station 208 may again be opened for further processing. Once isolated from the wet etching station 208, the transfer station 206 may open to the next station, e.g., the plasma treatment system 201, and the robotic arms, still holding the substrate 101, may extend into the next station and deposit the substrate 101 for further processing.

Figure 2C:
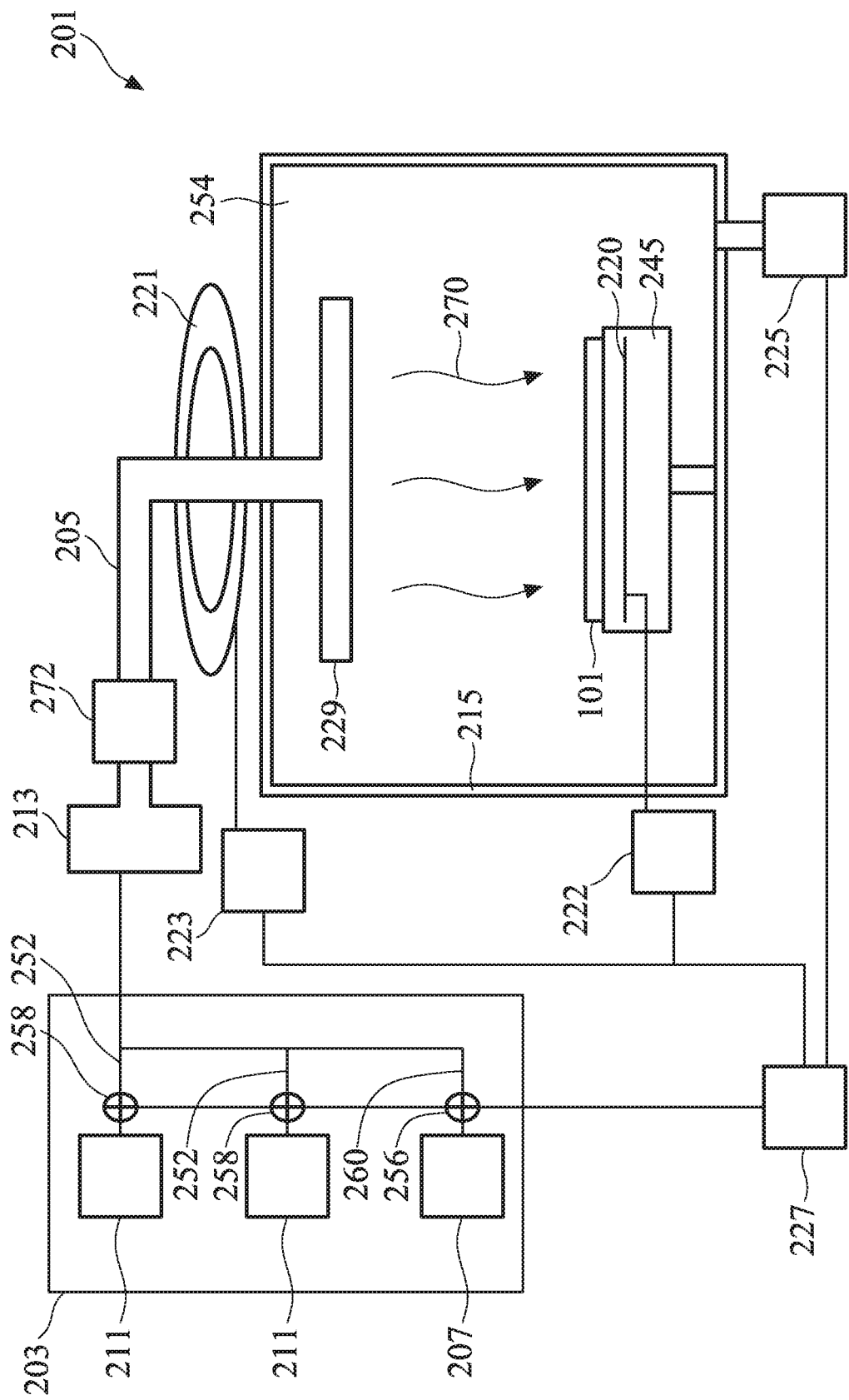

FIG. 2C illustrates an embodiment of one of the plurality of plasma treatment systems 201 (along with the inputs and exhausts) that may be used in order to treat the exposed surfaces. In an embodiment the plasma treatment system 201 may comprise a treatment gas delivery system 203 that may deliver one or more treatment gases to a plasma treatment chamber 254. The treatment gas delivery system 203 supplies the various desired treatment gases to the plasma treatment chamber 254 through a treatment gas controller 213 and a manifold 205. The treatment gas delivery system 203 may also help to control the flow rate of the treatment gases into the plasma treatment chamber 254 by controlling the flow and pressure of a carrier gas through the treatment gas delivery system 203.

In an embodiment the treatment gas delivery system 203 may include a plurality of treatment gas suppliers 211 along with an optional carrier gas supply 207. Additionally, while only two treatment gas suppliers 211 are illustrated in FIG. 2C, this is done merely for clarity, as any suitable number of treatment gas suppliers 211, such as one treatment gas supplier 211 for each treatment gas desired to be used within the plasma treatment system 201, may be used. For example, in an embodiment in which five separate treatment gases will be utilized, there may be five separate treatment gas suppliers 211.

Each of the individual treatment gas suppliers 211 may be a vessel, such as a gas storage tank, that is located either locally to the plasma treatment chamber 254 or remotely from the plasma treatment chamber 254. Alternatively, the treatment gas supplier 211 may be a facility that independently prepares and delivers the desired treatment gases. Any suitable source for the desired treatment gases may be utilized as the treatment gas supplier 211, and all such sources are fully intended to be included within the scope of the embodiments.

In an embodiment the individual treatment gas suppliers 211 supply a treatment gas to the treatment gas controller 213 through first lines 252 with first valves 258. The first valves 258 are controlled by a controller 227 that controls and regulates the introduction of the various treatment and carrier gases to the plasma treatment chamber 254.

Optionally, in embodiments in which the treatment gas within the treatment gas suppliers 211 are not inert gases themselves, a carrier gas supply 207 may supply a desired carrier gas, or diluent gas, that may be used to help push or "carry" the various desired treatment gases to the plasma treatment chamber 254. The carrier gas may be an inert gas or other gas that does not react with the treatment gases or with by-products from the reactions of the treatment gases. For example, the carrier gas may be nitrogen (N$_2$), helium (He), argon (Ar), combinations of these, or the like, although other suitable carrier gases may be utilized.

The carrier gas supply 207, or diluent supply, may be a vessel, such as a gas storage tank, that is located either locally to the plasma treatment chamber 254 or remotely from the plasma treatment chamber 254. Alternatively, the carrier gas supply 207 may be a facility that independently prepares and delivers the carrier gas to the treatment gas controller 213. Any suitable source for the carrier gas may be utilized as the carrier gas supply 207, and all such sources are fully intended to be included within the scope of the embodiments. The carrier gas supply 207 may supply the desired carrier gas to the treatment gas controller 213 through a second line 260 with a second valve 256 that connects the carrier gas supply 207 to the first lines 252. The second valve 256 is also controlled by the controller 227 that controls and regulates the introduction of the various etchants and carrier gases to the plasma treatment chamber 254. Once combined, the lines may be directed towards the treatment gas controller 213 for a controlled entry into the plasma treatment chamber 254.

The plasma treatment chamber 254 may be any desired shape that may be suitable for dispersing the treatment gases and contacting the treatment gases with the substrate 101. In the embodiment illustrated in FIG. 2C, the plasma treatment chamber 254 has a cylindrical sidewall and a bottom. However, the plasma treatment chamber 254 is not limited to a cylindrical shape, and any other suitable shape, such as a hollow square tube, an octagonal shape, or the like, may alternatively be utilized. Furthermore, the plasma treatment chamber 254 may be surrounded by a chamber housing 215 made of material that is inert to the various process materials. As such, while the chamber housing 215 may be any suitable material that can withstand the chemistries and pressures involved in the treatment process, in an embodiment the chamber housing 215 may be steel, stainless steel, nickel, aluminum, alloys of these, combinations of these, and the like.

Within the plasma treatment chamber 254 is located a mounting platform 245 in order to position and control the substrate 101 during the non-liquid, plasma treatment process 270. The mounting platform 245 may hold the substrate 101 using a combination of clamps, vacuum pressure, and/or electrostatic forces, and may also include heating and cooling mechanisms in order to control the temperature of the substrate 101 during the processes. In a particular embodiment the mounting platform 245 may comprise four cooling zones, such as an inner temperature zone, a middle inner temperature zone, a middle outer temperature zone, and an outer temperature zone (not individually illustrated) in order to heat and cool the substrate 101 during the treatment process. The various temperature zones may use gaseous or liquid heat transfer materials to precisely control the temperature of the substrate 101 during the treatment process, although any suitable number of heating or cooling zones may alternatively be utilized.

The mounting platform 245 may additionally comprise a first electrode 220 coupled to a first RF generator 222. The first electrode 220 may be electrically biased by the first RF generator 222 (under control of the controller 227) at a RF voltage during the plasma treatment process 270. By being electrically biased, the first electrode 220 is used to provide a bias to the incoming treatment gases and assist to ignite them into a plasma. Additionally, the first electrode 220 is also utilized to maintain the plasma during the plasma treatment process 270 by maintaining the bias.

Furthermore, while a single mounting platform 245 is illustrated in FIG. 2C, this is merely intended for clarity and is not intended to be limiting. Rather, any number of mounting platforms 245 may additionally be included within the plasma treatment chamber 254. As such, multiple semiconductor substrates may be etched during a single plasma treatment process.

Additionally, the plasma treatment chamber 254 comprises a showerhead 229. In an embodiment the showerhead 229 receives the various treatment gases from the manifold 205 (through, e.g., treatment heater 272) and helps to disperse the various treatment gases into the plasma treatment chamber 254. The showerhead 229 may be designed to evenly disperse the treatment gases in order to minimize undesired process conditions that may arise from uneven dispersal. In an embodiment the showerhead 229 may have a circular design with openings dispersed evenly around the showerhead 229 to allow for the dispersal of the desired treatment gases into the plasma treatment chamber 254.

The plasma treatment chamber 254 also comprises an upper electrode 221, for use as a plasma generator. In an embodiment the plasma generator may be a transformer coupled plasma generator and may be, e.g., a coil. The coil may be attached to a second RF generator 223 that is utilized to provide power to the upper electrode 221 (under control of the controller 227) in order to ignite the plasma during introduction of the treatment gases.

However, while the upper electrode 221 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be utilized. All such methods are fully intended to be included within the scope of the embodiments.

The plasma treatment chamber 254 may also be connected to one or more vacuum pumps 225 for exhaust from the plasma treatment chamber 254. In an embodiment the vacuum pump 225 is under the control of the controller 227, and may be utilized to control the pressure within the plasma treatment chamber 254 to a desired pressure. Additionally, once the treatment process is completed, the vacuum pump 225 may be utilized to evacuate the plasma treatment chamber 254 in preparation for removal of the substrate 101.

The plasma treatment process (represented in FIG. 2C by the wavy lines labeled 270 may be initiated by placing the desired treatment gases into the treatment gas suppliers 211 while placing the desired diluent into the carrier gas supply 207. As such, while the precise treatment gases and carrier gases are dependent at least in part upon the materials of the overlying structure (e.g., the first etch stop layer 107, the conductive elements 105, the second etch stop layer 109, etc.) and the residue 131, in a particular embodiment in which the first etch stop layer 107 is aluminum oxynitride and the conductive elements 105 are copper, treatment gases such as $N_2$, $H_2$, $CH_4$, $O_2$, ozone, Ar, Air, $N_2H_2$, $N_2H_4$, $C_xF_y$, combinations of these, or the like, may be placed within the treatment gas suppliers 211. Additionally, in embodiments in which the treatment gases are non-reactive, the carrier gas may be a non-reactive gas such as argon, helium, combinations of these, or the like, and may be placed into the carrier gas supply 207. However, any suitable treatment gases and diluents may be utilized.

Optionally, or sequentially if desired, the treatment gases may be chosen so as to releases charges that might have built up during previous processes and may cause defects. In one embodiment the treatment gases are chosen based on the treatment gases ability to either neutralize the charges that are already present or else at least do not generate additional charges during the plasma treatment process 270. In particular embodiments the treatment gases may be chosen to be cations or anions such as nitrogen ($N_2$) or hydrogen ($H_2$), which release any charges that are already present.

Once the treatment gas or gases have been placed within the treatment gas suppliers 211, the plasma treatment process 270 may be initiated by the controller 227 connecting the desired treatment gas suppliers 211 and, optionally, the carrier gas supply 207 to the plasma treatment chamber 254. In a particular embodiment the treatment gas may be introduced to the plasma treatment chamber 254 at a flow rate of between about 100 mL/h and about 300 mL/h, such as about 250 mL/h. Additionally, the plasma treatment chamber 254 may be kept at a process temperature of between about 25° C. and about 80° C., such as about 30° C., and a process pressure of between about 0.1 Torr and about 100 Torr, such as about 50 Torr. However, any suitable flow rates, temperatures, and pressures may be utilized.

Once the treatment gases have been introduced into the plasma treatment chamber 254, the treatment gases may be ignited into the plasma. In an embodiment the controller 227 may begin by first applying an RF power at 60 MHz (the source power at the upper electrode 221) of between about 100 W and about 1000 W, such as about 200 W and applying an RF power at 2 MHz (the bias power at the first electrode 220) of between about 100 W and about 1000 W, such as about 200 W. The ignition step may be maintained for a time of between about 1 s and about 100 s, such as about 2 seconds in order to ensure ignition of the plasma.

Once ignition has occurred, the plasma treatment process 270 may be utilized to treat the exposed surfaces and ensure that any remaining residues 131 are removed from the via openings 119 and the trench openings 129. In an embodiment the plasma treatment process 270, controlled by the controller 227, sets the RF power at 60 MHz to between about 200 W and about 2000 W, such as about 1500 W and also setting the RF power at 2 MHz to between about 200 W and about 2000 W, such as about 1500 W. The plasma treatment process 270 will proceed with treating the exposed surfaces for a time of between about 5 s and about 100 s, such as about 45 seconds. However, any suitable process parameters and time periods may be utilized.

Additionally, while a specific embodiment of the etching process has been described above with respect to FIG. 2C, these discussions are intended to be illustrative only and are not intended to be limiting upon the embodiments. Rather, any suitable combination of etchants, carrier gases, and process conditions may be utilized. All such combinations are fully intended to be included within the scope of the embodiments.

By utilizing the wet stripping process along with the plasma treatment, defects from the presence of the polymeric residues may be reduced or even completed eliminated. Further, metal corrosion (e.g., oxidation) or galvanic effects that occur due to the presence of a wet strip and deionized water rinse may also be avoided. Finally, abnormal film loss because of incoming charging from dry etching can be avoided through the charge release. All of this helps achieve a better adhesion and coverage of later deposited materials (e.g., the first barrier layer 301 and conductive material, described further below with respect to FIG. 3).

Additionally, while the above described cleaning process is described as comprising the wet cleaning process 250 occurring prior to the plasma treatment process 270, this is intended to be illustrative and is not intended to be limiting. Rather, any suitable order of process steps, such as performing the plasma treatment process 270 before the wet cleaning process 250, may also be utilized. Any suitable order of process steps is fully intended to be included within the scope of the embodiments.

After the cleaning process has been completed, the first barrier layer 301 may be deposited in order to help isolate and protect a subsequently formed conductive material (discussed further below). In an embodiment the first barrier layer 301 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 301 may be formed to have a thickness of between about 0.1 µm and about 20 µm, such as about 0.5 µm.

Once the first barrier layer 301 has been formed to line the trench openings 129 and the via openings 119, the trench openings 129 and the via openings 119 are filled with a conductive material to form the interconnect 305 with a via portion 307 (within the via openings 119) and the trench portion 303 (within the trench opening 129, and illustrated as being separated from the via portion 307 using a dashed line, although there may or may not be a physical indication of the separation). The conductive material may comprise copper, although other suitable materials such as aluminum, alloys, doped polysilicon, combinations thereof, and the like, may alternatively be utilized. The conductive material may be formed by depositing a seed layer (not separately illustrated), electroplating copper onto the seed layer, and filling and overfilling the trench openings 129 and the via opening 119. Once the trench openings 129 and the via opening 119 have been filled, excess portions of the first barrier layer 301, the seed layer, and conductive material outside of the trench openings 129 and the via opening 119 may be removed through a planarization process such as chemical mechanical polishing (CMP), although any suitable removal process may be used.

In an embodiment, a semiconductor device manufacturing tool includes a first wet etch cleaning station; a first plasma treatment station; and a transfer station operationally located between the first wet etch cleaning station and the first plasma treatment station; and an exterior housing surrounding all of the first wet etch cleaning station, the first plasma treatment station, and the transfer station. In an embodiment, the semiconductor device manufacturing tool further includes a second wet etch cleaning station. In an embodiment, the semiconductor device manufacturing tool further includes a feed tank operationally connected to both the first wet etch cleaning station and the second wet etch cleaning station. In an embodiment, the semiconductor device manufacturing tool further includes a second plasma treatment station. In an embodiment, the semiconductor device manufacturing tool further includes a first treatment gas supplier operationally connected to both the first plasma treatment station and the second plasma treatment station. In another embodiment, the first treatment gas supplier contains a charge release treatment gas. In another embodiment the first wet etch cleaning station is a spin-on station.

In an embodiment, a semiconductor device manufacturing tool includes a wet etch section comprising a plurality of wet etching chambers; a first transfer station located to operate cooperatively with at least one of the wet etching chambers; and a plasma treatment section comprising a plurality of plasma treatment chambers, wherein at least one of the plurality of plasma treatment chambers is located to operate cooperatively with the first transfer station, wherein the wet etch section, the first transfer station, and the plasma treatment section are part of a single machine. In an embodiment, the semiconductor device manufacturing tool further includes a feed tank connected to each of the wet etching chambers. In an embodiment, the semiconductor device manufacturing tool further includes a first input to the feed tank; a second input to the feed tank; and a third input to the feed tank. In another embodiment, the first input is connected to a mixing unit. In another embodiment, the second input is a spike input. In another embodiment, the third input is a recycle input from the wet etching chambers. In another embodiment, at least one of the wet etching chambers comprises a rotatable chuck.

In another embodiment a method of manufacturing a semiconductor device, the method includes forming an opening through a dielectric layer to expose a conductive element of a semiconductor wafer; placing the semiconductor wafer into a first processing tool; wet cleaning the semiconductor wafer within the first processing tool; plasma cleaning the semiconductor wafer within the first processing tool; and removing the semiconductor wafer from the first processing tool after the plasma cleaning the semiconductor wafer. In another embodiment, the wet cleaning is performed at least in part using a spin on process. In another embodiment, the spin on process comprises contacting a wet etchant onto the semiconductor wafer. In another embodiment, the contacting the wet etchant comprises removing the wet etchant from a feed tank. In another embodiment, the plasma cleaning releases charges on the semiconductor wafer. In another embodiment, the plasma cleaning generates a plasma from nitrogen or hydrogen.

In another embodiment a method of manufacturing a semiconductor device, the method includes exposing a conductive layer through a dielectric layer over a semiconductor wafer; removing residue by contacting a liquid etchant to the dielectric layer and the conductive layer, wherein the contacting the liquid etchant is performed in a first wet etching chamber of a first processing tool; and performing a plasma cleaning after the removing the residue, wherein the performing the plasma cleaning is performed within a plasma treatment chamber of the first processing tool. In another embodiment, the plasma cleaning is performed using oxygen. In another embodiment, the plasma cleaning releases charges from dielectric layer. In another embodiment, the plasma cleaning is performed at least in part using the plasma of nitrogen or hydrogen. In another embodiment, the liquid etchant comprises an oxidant within a solvent. In another embodiment, the liquid etchant further comprises an inhibitor. In another embodiment, the residue is a fluorinated polymer.

In another embodiment a method of cleaning a semiconductor wafer includes placing a semiconductor wafer onto a spin chuck; dispensing a wet etchant onto the semiconductor wafer while the semiconductor wafer is spinning; removing the semiconductor wafer from the spin chuck and placing the semiconductor wafer onto a mounting platform within a plasma treatment chamber without breaking to an external atmosphere; and plasma treating the semiconductor wafer. In another embodiment, the plasma treating the semiconductor wafer further comprises releasing charges from the semiconductor wafer. In another embodiment, the plasma treating comprises generating a plasma from nitrogen. In another embodiment, the plasma treating comprises generating a plasma from hydrogen. In another embodiment, the dispensing the wet etchant comprises dispensing an oxidant. In an embodiment, the method further includes depositing a first barrier layer after the plasma treating the semiconductor wafer. In an embodiment, the method further includes plating a conductive material onto the first barrier layer.

In another embodiment a method of cleaning a semiconductor device includes placing a semiconductor device into a first processing tool; moving the semiconductor device to a wet etching section of the first processing tool; moving the semiconductor device to a plasma treatment section of the first processing tool; and removing the semiconductor device from the first processing tool. In an embodiment, the method further includes removing residue from the semiconductor device while the semiconductor device is located within the wet etching section. In an embodiment, the method further includes releasing charges from the semiconductor device while the semiconductor device is located within the plasma treatment section of the first processing tool. In another embodiment, the releasing charges from the semiconductor device further comprises generating a plasma from nitrogen or hydrogen. In another embodiment, the moving the semiconductor device to the wet etching section is performed prior to the moving the semiconductor device to the plasma treatment section of the first processing tool. In another embodiment, the moving the semiconductor device to the wet etching section is performed after the moving the semiconductor device to the plasma treatment section of the first processing tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming an opening through a dielectric layer to expose a conductive element of a semiconductor wafer, the opening exposing first sidewalls of the dielectric layer;
    placing the semiconductor wafer into a first processing tool;
    wet cleaning the opening within the first processing tool using a first etchant comprising an oxidizer and a solvent, the oxidizer comprising hydrogen peroxide, ozone water, or phosphate salt, wherein the first sidewalls of the dielectric layer are exposed by the opening during the wet cleaning;
    plasma cleaning the opening within the first processing tool after the wet cleaning, wherein the first sidewalls of the dielectric layer are exposed by the opening during the plasma cleaning; and
    forming a barrier layer along the first sidewalls of the dielectric layer and along an upper surface of the conductive element after the wet cleaning and the plasma cleaning, the barrier layer contacting the upper surface of the conductive element.

2. The method of claim 1, wherein the wet cleaning is performed at least in part using a spin on process.

3. The method of claim 1, wherein the plasma cleaning releases charges on the semiconductor wafer.

4. The method of claim 3, wherein the plasma cleaning generates plasma from nitrogen or hydrogen.

5. The method of claim 1, wherein forming the opening through the dielectric layer leaves residues in the opening, wherein the residues comprise a fluorinated polymer.

6. The method of claim 1, wherein the wet cleaning is performed in a wet etching station of the first processing tool, wherein the method further comprises:
    recycling the first etchant for the wet cleaning, wherein recycling the first etchant comprises:
        collecting, in a feed tank, the first etchant from an output of the wet etching station;
        analyzing the first etchant from the output of the wet etching station to determine a makeup amount of an effective component of the first etchant, wherein the makeup amount is determined to recover an effectiveness of the first etchant;
        adding the determined makeup amount of the effective component into the feed tank; and
        after the adding, supplying the first etchant in the feed tank to the wet etching station.

7. A method of manufacturing a semiconductor device, the method comprising:
    exposing a conductive layer disposed in a first dielectric layer of a semiconductor wafer by forming an opening through a second dielectric layer over the conductive layer;
    removing residue by contacting a liquid etchant to the second dielectric layer and the conductive layer, wherein the residue comprises a fluorinated polymer, and the liquid etchant comprises hydrogen peroxide, ozone water, or phosphate salt, wherein the contacting the liquid etchant is performed in a first wet etching chamber of a first processing tool, wherein during the removing the residue, the liquid etchant contacts sidewalls of the second dielectric layer exposed by the opening;
    performing a plasma cleaning after the removing the residue, wherein the performing the plasma cleaning is performed within a plasma treatment chamber of the first processing tool, wherein the sidewalls of the second dielectric layer are exposed by the opening during the plasma cleaning; and
    forming a barrier layer in the opening after performing the plasma cleaning, the barrier layer extending along and contacting an upper surface of the conductive layer and the sidewalls of the second dielectric layer.

8. The method of claim 7, wherein the plasma cleaning is performed using a gas source comprising nitrogen or hydrogen.

9. The method of claim 7, wherein the plasma cleaning releases charges from dielectric layer.

10. The method of claim 7, wherein the liquid etchant comprises an oxidant within a solvent.

11. The method of claim 7, wherein the liquid etchant further comprises an inhibitor.

12. The method of claim 7, wherein the conductive layer and the first dielectric layer have a coplanar upper surface facing the second dielectric layer.

13. A method of cleaning a semiconductor wafer, the method comprising:
- placing the semiconductor wafer onto a spin chuck, the semiconductor wafer having a conductive feature embedded in a first dielectric layer and a second dielectric layer over the conductive feature, wherein the second dielectric layer has an opening that exposes the conductive feature and exposes first sidewalls of the second dielectric layer;
- dispensing a wet etchant onto the semiconductor wafer while the semiconductor wafer is spinning, the wet etchant in direct contact with the first sidewalls of the second dielectric layer, the wet etchant comprising an oxidizer and an organic solvent, the oxidizer comprising hydrogen peroxide, ozone water, or phosphate salt;
- removing the semiconductor wafer from the spin chuck and placing the semiconductor wafer onto a mounting platform within a plasma treatment chamber without breaking to an external atmosphere;
- plasma treating the first sidewalls of the second dielectric layer using a gas source comprising diazene ($N_2H_2$) or hydrazine ($N_2H_4$); and
- forming a barrier layer lining the first sidewalls of the second dielectric layer after the plasma treating, wherein the barrier layer extends along and contacts an upper surface of the conductive feature facing the second dielectric layer.

14. The method of claim 13, wherein the plasma treating the semiconductor wafer further comprises releasing charges from the semiconductor wafer.

15. The method of claim 14, wherein the gas source of the plasma treating further comprises nitrogen or hydrogen.

16. The method of claim 13, further comprising plating a conductive material onto the barrier layer.

17. The method of claim 13, wherein the dispensing the wet etchant and the plasma treating the semiconductor wafer are performed in a same processing tool without breaking to an exterior atmosphere.

18. The method of claim 13, wherein the mounting platform includes a first electrode, where performing the plasma treating comprises:
- supplying a treatment gas into the plasma treatment chamber;
- igniting the treatment gas into plasma by applying a first radio frequency (RF) power source to the first electrode and applying a second RF power source to a second electrode disposed over the first electrode, wherein a first RF frequency of the first RF power source is lower than a second RF frequency of the second RF power source; and
- after igniting the treatment gas, increasing a first power of the first RF power source and a second power of the second RF power source.

19. The method of claim 18, wherein the first electrode is inside the plasma treatment chamber, and the second electrode is outside the plasma treatment chamber.

20. The method of claim 13, wherein a concentration of the oxidizer in the wet etchant is less than about 25%, and a concentration of the organic solvent in the wet etchant is between about 5% and about 50%.

* * * * *